United States Patent
Li

(10) Patent No.: US 11,133,480 B2
(45) Date of Patent: Sep. 28, 2021

(54) WEARABLE DEVICE COMPRISING STRIP-SHAPED SUBSTRATE AND FLEXIBLE DISPLAY PANEL

(71) Applicant: Wuhan China Star Optoelectronics Semiconductor Display Technology Co., Ltd., Hubei (CN)

(72) Inventor: Xian Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/319,742

(22) PCT Filed: Aug. 28, 2018

(86) PCT No.: PCT/CN2018/102656
§ 371 (c)(1),
(2) Date: Jan. 22, 2019

(87) PCT Pub. No.: WO2019/232938
PCT Pub. Date: Dec. 12, 2019

(65) Prior Publication Data
US 2021/0083209 A1    Mar. 18, 2021

(30) Foreign Application Priority Data
Jun. 4, 2018    (CN) .......................... 201810563115.X

(51) Int. Cl.
*H01L 51/00*    (2006.01)
*A44C 5/00*    (2006.01)
*H01L 27/32*    (2006.01)
*H01L 51/52*    (2006.01)
*G09F 9/30*    (2006.01)

(52) U.S. Cl.
CPC ........ *H01L 51/0097* (2013.01); *A44C 5/0015* (2013.01); *A44C 5/0053* (2013.01); *H01L 27/3244* (2013.01); *H01L 51/524* (2013.01); *G09F 9/301* (2013.01); *H01L 2251/5338* (2013.01)

(58) Field of Classification Search
CPC .. H01L 51/0097; A44C 5/0053; A44C 5/0015
See application file for complete search history.

(56) References Cited

U.S. PATENT DOCUMENTS

2016/0351848 A1*    12/2016    Kodama ............. H01L 51/0097
2017/0098668 A1*    4/2017    Huitema ........... G02F 1/136286

FOREIGN PATENT DOCUMENTS

| CN | 203520364 U | 4/2014 |
|----|-------------|--------|
| CN | 105786101 A | 7/2016 |
| CN | 105892969 A | 8/2016 |

* cited by examiner

*Primary Examiner* — Hoai V Pham
(74) *Attorney, Agent, or Firm* — Hamre, Schumann, Mueller & Larson, P.C.

(57) ABSTRACT

A wearable device includes a strip-shaped substrate, a flexible display panel disposed on the strip-shaped substrate, and a flexible cover plate disposed on the flexible display panel. The wearable device can return from a bent state to a stretched state, so as to provide a user with a larger screen.

11 Claims, 4 Drawing Sheets

WEARABLE DEVICE COMPRISING STRIP-SHAPED SUBSTRATE AND FLEXIBLE DISPLAY PANEL

FIELD OF INVENTION

The present disclosure relates to the field of electronic products, and more particularly to a wearable device.

BACKGROUND OF INVENTION

Conventional wearable devices are small, and therefore screens associated with the conventional wearable devices are also small. Small screens are inconvenient for user operations, thus limiting functional development of the conventional wearable devices.

Therefore, it is necessary to provide a new technical solution to solve the above technical problems.

SUMMARY OF INVENTION

An object of the present disclosure is to provide a wearable device, which can return from a bent state to a stretched state, so as to provide a user with a larger screen.

To achieve the above object, an embodiment of the present disclosure provides a wearable device including a strip-shaped substrate, a flexible display panel disposed on the strip-shaped substrate, and a flexible cover plate disposed on the flexible display panel. When the strip-shaped substrate is in a stretched state, the strip-shaped substrate has an elongated shape. A surface of the strip-shaped substrate has a predetermined arc in a direction perpendicular to a long-side direction of the strip-shaped substrate. The strip-shaped substrate has an outer convex surface and an inner concave surface, and the outer convex surface and the inner concave surface each have the predetermined arc. The outer convex surface faces the flexible display panel and the inner concave surface faces away from the flexible display panel, or the outer convex surface faces away from the flexible display panel and the inner concave surface faces the flexible display panel. When the strip-shaped substrate is in a bent state, the strip-shaped substrate has an arc shape or an annular shape.

In an embodiment of the present disclosure, the strip-shaped substrate is bent from the elongated shape to the arc shape or the annular shape when the strip-shaped substrate is subjected to a first external force, such that the wearable device is bent into a display device with the arc shape or the annular shape.

An embodiment of the present disclosure further provides a wearable device including a strip-shaped substrate, a flexible display panel disposed on the strip-shaped substrate, and a flexible cover plate disposed on the flexible display panel.

In an embodiment of the present disclosure, when the strip-shaped substrate is in a stretched state, the strip-shaped substrate has an elongated shape.

In an embodiment of the present disclosure, a surface of the strip-shaped substrate has a predetermined arc in a direction perpendicular to a long-side direction of the strip-shaped substrate, the strip-shaped substrate has an outer convex surface and an inner concave surface, and the outer convex surface and the inner concave surface each have the predetermined arc.

In an embodiment of the present disclosure, the outer convex surface faces the flexible display panel and the inner concave surface faces away from the flexible display panel, or the outer convex surface faces away from the flexible display panel and the inner concave surface faces the flexible display panel.

In an embodiment of the present disclosure, when the strip-shaped substrate is in a bent state, the strip-shaped substrate has an arc shape or an annular shape.

In an embodiment of the present disclosure, the strip-shaped substrate is bent from the elongated shape to the arc shape or the annular shape when the strip-shaped substrate is subjected to a first external force, such that the wearable device is bent into a display device with the arc shape or the annular shape.

In an embodiment of the present disclosure, the strip-shaped substrate is stretched from the arc shape or the annular shape to the elongated shape when the strip-shaped substrate is subjected to a second external force, such that the wearable device is stretched into the display device with the elongated shape.

In an embodiment of the present disclosure, the wearable device further includes a first end and a second end, the first end and the second end are two opposite ends of the strip-shaped substrate, and the first end and the second end are interlocked when the strip-shaped substrate is bent into the annular shape.

In an embodiment of the present disclosure, the first end includes a first clamping part, the second end includes a second clamping part, and the first clamping part and the second clamping part are engaged with each other.

In an embodiment of the present disclosure, the first clamping part and the second clamping part are magnetic components.

In an embodiment of the present disclosure, a shape and an area of the strip-shaped substrate, a shape and an area of the flexible display panel, and a shape and an area of the flexible cover plate are same.

In an embodiment of the present disclosure, a material of the strip-shaped substrate includes one or more alloys of the elements selected from the group consisting of steel, copper, iron, aluminum, and nickel, or the material of the strip-shaped substrate includes plastic or carbon fiber.

In an embodiment of the present disclosure, the wearable device further includes at least one structural reinforcing rib disposed on the outer convex surface of the strip-shaped substrate.

In an embodiment of the present disclosure, a length direction of the structural reinforcing rib and a long-side direction of the strip-shaped substrate have a predetermined included angle, and the predetermined included angle is greater than 0 degree.

In an embodiment of the present disclosure, the structural reinforcing rib is configured to reinforce a structural strength of the wearable device and is configured to maintain the outer convex surface and the inner concave surface with a predetermined arc when the strip-shaped substrate is in a stretched state.

In an embodiment of the present disclosure, a cross section of the structural reinforcing rib is substantially trapezoidal, a bottom surface of the structural reinforcing rib is an arc surface, and the bottom surface of the structural reinforcing rib fits the outer convex surface of the strip-shaped substrate.

In an embodiment of the present disclosure, a material of the structural reinforcing rib includes one or more selected from the group consisting of rubber, plastic, and carbon fiber.

In an embodiment of the present disclosure, the structural reinforcing rib is covered with a metal strip.

Compared to existing technologies, since the wearable device of the embodiment of the present disclosure includes the strip-shaped substrate and the flexible display panel, the flexible display panel is disposed on the strip-shaped substrate, and the strip-shaped substrate is stretched from the arc shape or the annular shape to the elongated shape when the strip-shaped substrate is subjected to an external force, such that the wearable device can return from the bent state to the stretched state, so as to provide a user with a larger screen.

The accompanying figures in the description of embodiments of the present disclosure will be described in brief to more clearly illustrate the technical solutions of the embodiments.

DETAILED DESCRIPTION OF PREFERRED EMBODIMENTS

The term "embodiment" as used in the specification means serving as an example, implementation, or illustration. Furthermore, the articles "a" or "an" as used in the specification and the appended claims may generally be construed to mean "one or more" unless it is clearly specified to be the singular form in the context.

Figure 1:
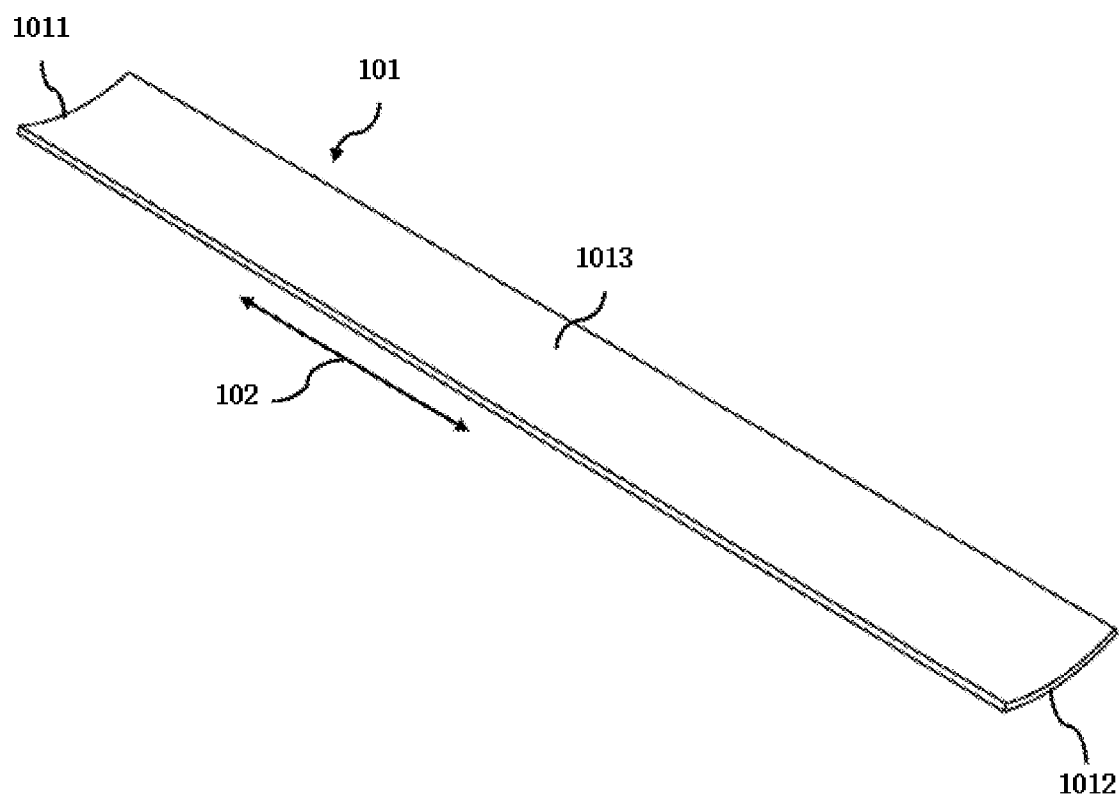
FIG. 1 is a schematic diagram of a wearable device in a stretched state according to a first embodiment of the present disclosure.
Figure 2:
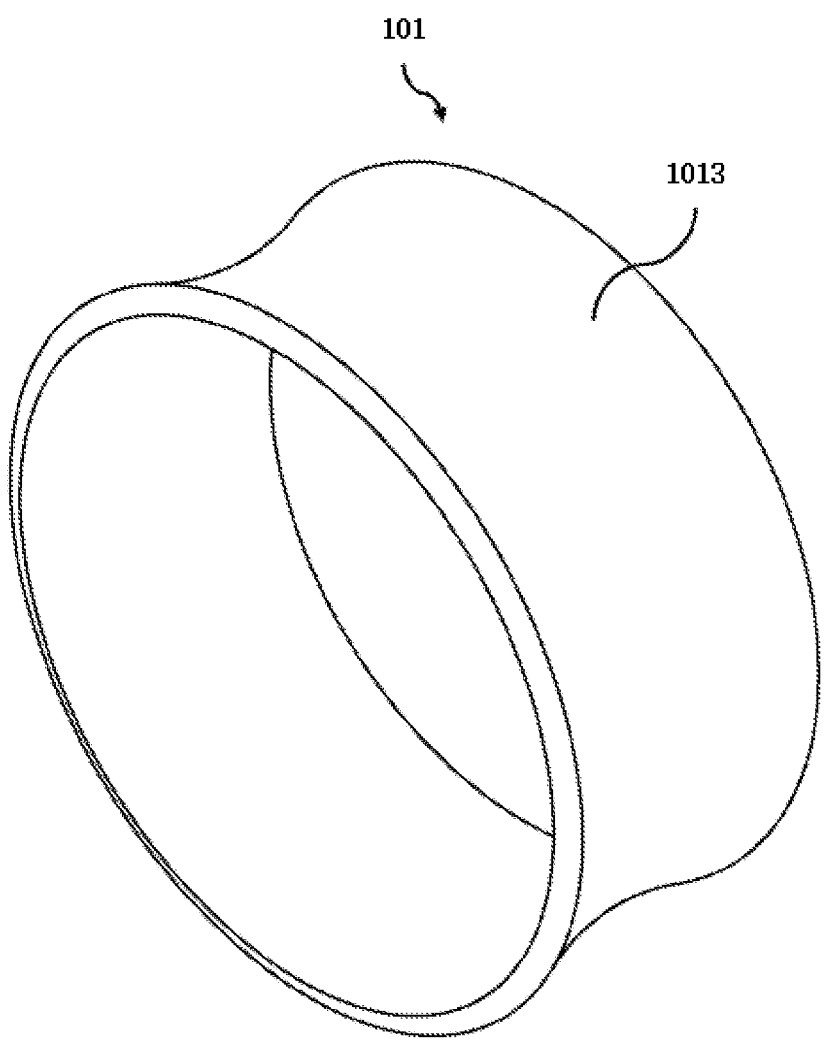
FIG. 2 is a schematic diagram of the wearable device in a bent state according to the first embodiment of the present disclosure.
Figure 3:
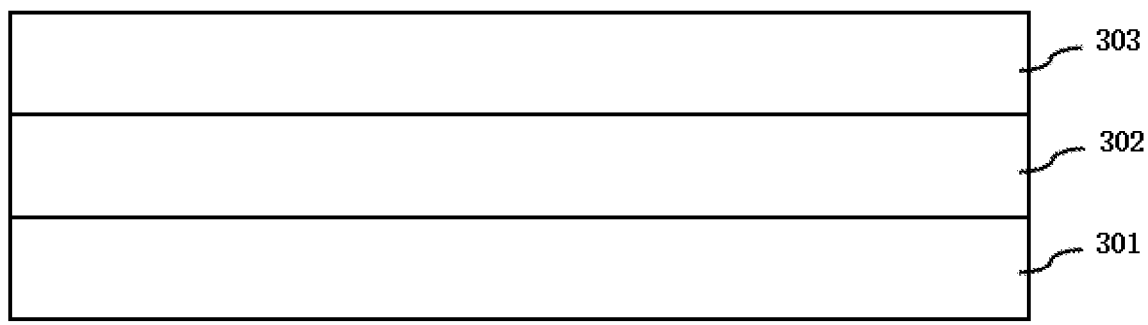
FIG. 3 is a schematic diagram of a longitudinal section of the wearable device according to the first embodiment of the present disclosure.

Refer to FIG. 1, FIG. 2, and FIG. 3, wherein FIG. 1 is a schematic diagram of a wearable device in a stretched state according to a first embodiment of the present disclosure, FIG. 2 is a schematic diagram of the wearable device in a bent state according to the first embodiment of the present disclosure, and FIG. 3 is a schematic diagram of a longitudinal section of the wearable device according to the first embodiment of the present disclosure.

A wearable device 101 of the embodiment includes a strip-shaped substrate 301, a flexible display panel 302, and a flexible cover plate 303.

The flexible display panel 302 is disposed on the strip-shaped substrate 301. The flexible display panel 302 may be, for example, an organic light emitting diode (OLED).

The flexible cover plate 303 is disposed on the flexible display panel 302.

The strip-shaped substrate 301, the flexible display panel 302, and the flexible cover plate 303 are stacked and integrated into one body.

When the strip-shaped substrate 301 is in a stretched state, the strip-shaped substrate 301 has an elongated shape.

A surface of the strip-shaped substrate 301 has a predetermined arc in a direction perpendicular to a long-side direction 102 (that is, a short-side direction of the strip-shaped substrate 301) of the strip-shaped substrate 301.

A side of the strip-shaped substrate 301 facing away from the flexible display panel 302 is an arc surface with the predetermined arc, and the arc surface protrudes away from the flexible display panel 302.

The strip-shaped substrate 301 has an outer convex surface and an inner concave surface, and the outer convex surface and the inner concave surface each have the predetermined arc.

The outer convex surface faces away from the flexible display panel 302 and the inner concave surface faces the flexible display panel 302. That is, a display surface 1013 (a light exit surface) of the wearable device 101 is inwardly recessed.

When the strip-shaped substrate 301 is in a bent state, the strip-shaped substrate 301 has an arc shape or an annular shape. The arc surface faces a center of the stripe-shaped substrate 301 having the arc shape or the annular shape.

The strip-shaped substrate 301 is bent from the elongated shape to the arc shape or the annular shape when the strip-shaped substrate 301 is subjected to a first external force, such that the wearable device 101 is bent into a display device with the arc shape or the annular shape.

The strip-shaped substrate 301 is stretched from the arc shape or the annular shape to the elongated shape when the strip-shaped substrate 301 is subjected to a second external force, such that the wearable device 101 is stretched into the display device with the elongated shape.

The wearable device 101 includes a first end 1011 and a second end 1012, the first end 1011 and the second end 1012 are two opposite ends of the strip-shaped substrate 301.

The first end 1011 and the second end 1012 are interlocked when the strip-shaped substrate 301 is bent into the annular shape.

In details, the first end 1011 includes a first clamping part, the second end 1012 includes a second clamping part, and the first clamping part and the second clamping part are engaged with each other.

The first clamping part and the second clamping part are magnetic components.

A shape and an area of the strip-shaped substrate 301, a shape and an area of the flexible display panel, and a shape and an area of the flexible cover plate 303 are same.

A material of the strip-shaped substrate 301 includes one or more alloys of the elements selected from the group consisting of steel, copper, iron, aluminum, and nickel, or the material of the strip-shaped substrate 301 includes plastic or carbon fiber.

When the strip-shaped substrate 301 has the arc shape or the annular shape, the strip-shaped substrate 301 and a long side of the strip-shaped substrate 301 is curved.

The wearable device 101 further includes at least one structural reinforcing rib disposed on the outer convex surface of the strip-shaped substrate 301. A length direction of the structural reinforcing rib and a long-side direction 102 of the strip-shaped substrate 301 have a predetermined included angle, and the predetermined included angle is greater than 0 degree. Preferably, the predetermined included angle is 90 degrees.

The structural reinforcing rib is configured to reinforce a structural strength of the wearable device 101 and is configured to maintain the outer convex surface and the inner concave surface with a predetermined arc when the strip-shaped substrate 301 is in a stretched state.

A cross section of the structural reinforcing rib is substantially trapezoidal, a bottom surface of the structural reinforcing rib is an arc surface, and the bottom surface of the structural reinforcing rib fits the outer convex surface of the strip-shaped substrate 301.

A material of the structural reinforcing rib includes one or more selected from the group consisting of rubber, plastic, and carbon fiber. The structural reinforcing rib is covered with a metal strip.

Figure 4:
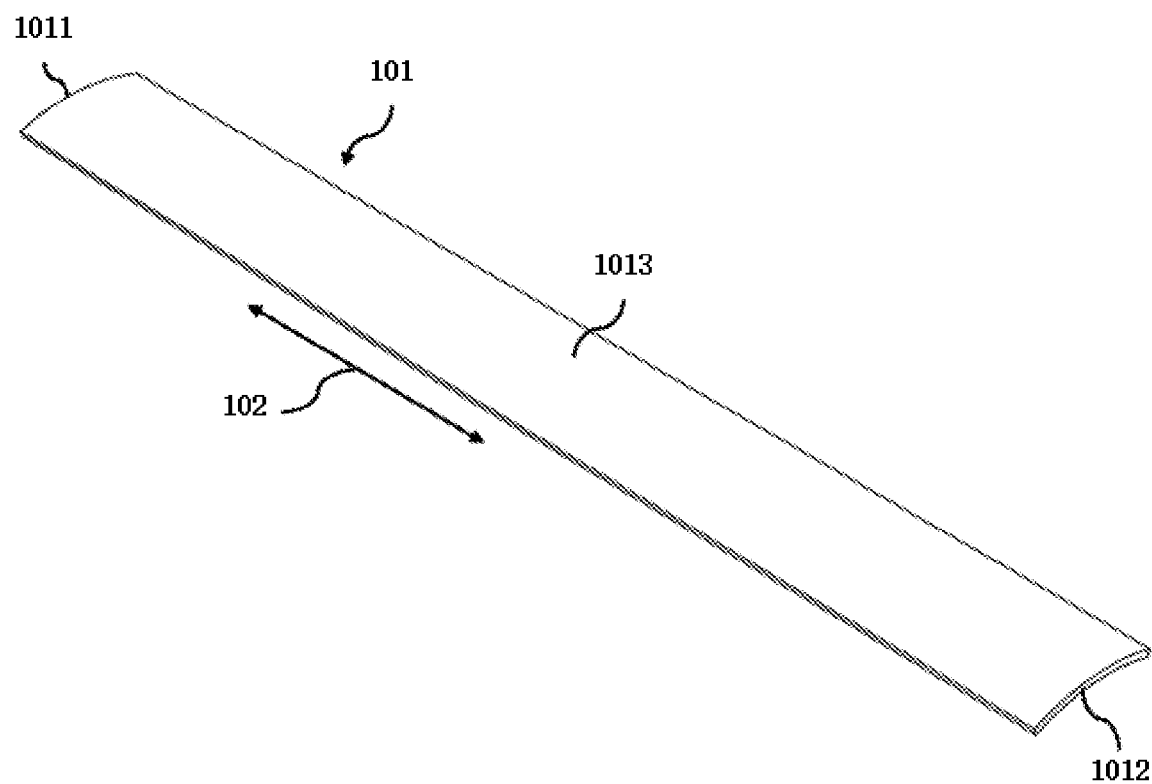
FIG. 4 is a schematic diagram of a wearable device in a stretched state according to a second embodiment of the present disclosure.
Figure 5:
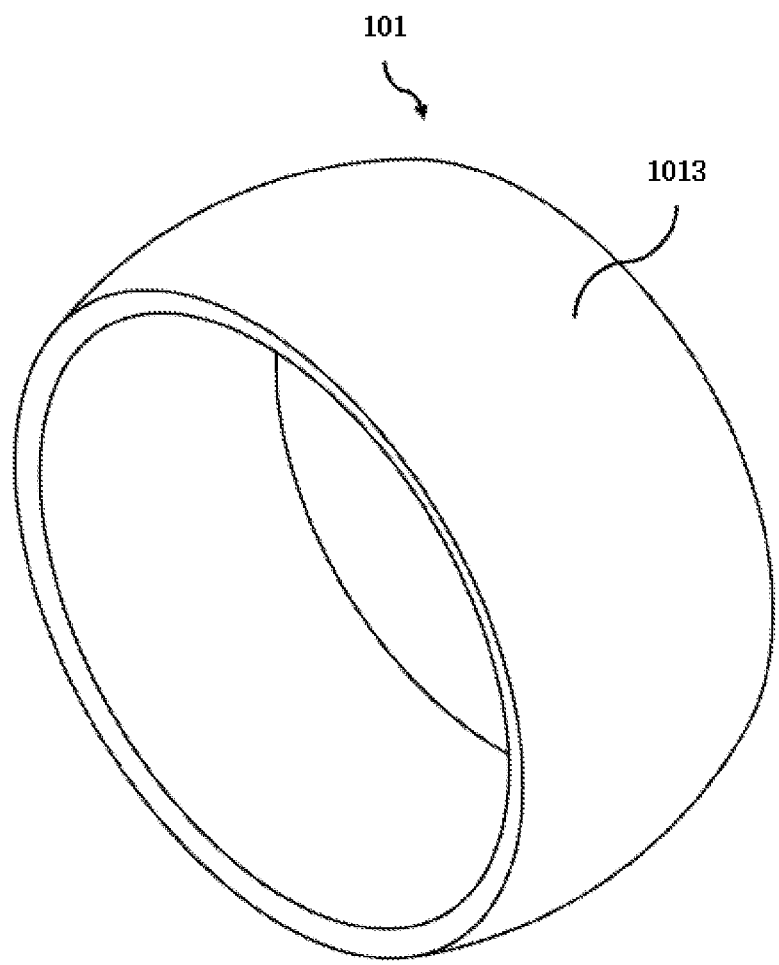
FIG. 5 is a schematic diagram of the wearable device in a bent state according to the second embodiment of the present disclosure.

Refer to FIG. 4 and FIG. 5, wherein FIG. 4 is a schematic diagram of a wearable device in a stretched state according to a second embodiment of the present disclosure and FIG. 5 is a schematic diagram of the wearable device in a bent state according to the second embodiment of the present disclosure.

The second embodiment is similar to the first embodiment described above, except that: the outer convex surface faces the flexible display panel 302 and the inner concave surface faces away from the flexible display panel 302. That is, the display surface 1013 (the light exit surface) of the wearable device 101 protrudes outward.

Compared to existing technologies, since the wearable device 101 of the embodiment of the present disclosure includes the strip-shaped substrate 301 and the flexible display panel 302, the flexible display panel 302 is disposed on the strip-shaped substrate 301, and the strip-shaped substrate 301 is stretched from the arc shape or the annular shape to the elongated shape when the strip-shaped substrate 301 is subjected to an external force, such that the wearable device 101 can return from the bent state to the stretched state, so as to provide a user with a larger screen.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A wearable device, comprising:
   a strip-shaped substrate;
   a flexible display panel disposed on the strip-shaped substrate; and
   a flexible cover plate disposed on the flexible display panel;
   wherein when the strip-shaped substrate is in a stretched state, the strip-shaped substrate has an elongated shape;
   wherein a surface of the strip-shaped substrate has a predetermined arc in a direction perpendicular to a long-side direction of the strip-shaped substrate;
   wherein the strip-shaped substrate has an outer convex surface and an inner concave surface, and the outer convex surface and the inner concave surface each have the predetermined arc;
   wherein the outer convex surface faces the flexible display panel and the inner concave surface faces away from the flexible display panel, or the outer convex surface faces away from the flexible display panel and the inner concave surface faces the flexible display panel;
   wherein when the strip-shaped substrate is in a bent state, the strip-shaped substrate has an arc shape or an annular shape;
   wherein an area of the strip-shaped substrate, an area of the flexible display panel, and an area of the flexible cover plate are same.

2. The wearable device according to claim 1, wherein the strip-shaped substrate is bent from the elongated shape to the arc shape or the annular shape when the strip-shaped substrate is subjected to a first external force, such that the wearable device is bent into a display device with the arc shape or the annular shape.

3. A wearable device, comprising:
   a strip-shaped substrate;
   a flexible display panel disposed on the strip-shaped substrate; and
   a flexible cover plate disposed on the flexible display panel;
   wherein an area of the strip-shaped substrate, an area of the flexible display panel, and an area of the flexible cover plate are same.

4. The wearable device according to claim 3, wherein when the strip-shaped substrate is in a stretched state, the strip-shaped substrate has an elongated shape.

5. The wearable device according to claim 4, wherein a surface of the strip-shaped substrate has a predetermined arc in a direction perpendicular to a long-side direction of the strip-shaped substrate, the strip-shaped substrate has an outer convex surface and an inner concave surface, and the outer convex surface and the inner concave surface each have the predetermined arc.

6. The wearable device according to claim 5, wherein the outer convex surface faces the flexible display panel and the inner concave surface faces away from the flexible display panel, or the outer convex surface faces away from the flexible display panel and the inner concave surface faces the flexible display panel.

7. The wearable device according to claim 4, wherein when the strip-shaped substrate is in a bent state, the strip-shaped substrate has an arc shape or an annular shape.

8. The wearable device according to claim 4, wherein the strip-shaped substrate is bent from the elongated shape to the arc shape or the annular shape when the strip-shaped substrate is subjected to a first external force, such that the wearable device is bent into a display device with the arc shape or the annular shape.

9. The wearable device according to claim 8, wherein the strip-shaped substrate is stretched from the arc shape or the annular shape to the elongated shape when the strip-shaped substrate is subjected to a second external force, such that the wearable device is stretched into the display device with the elongated shape.

10. The wearable device according to claim 3, wherein a shape of the strip-shaped substrate, a shape of the flexible display panel, and a shape of the flexible cover plate are same.

11. The wearable device according to claim 3, wherein a material of the strip-shaped substrate comprises one or more alloys of the elements selected from the group consisting of steel, copper, iron, aluminum, and nickel, or the material of the strip-shaped substrate comprises plastic or carbon fiber.

* * * * *